United States Patent [19]

Keller

[11] 4,331,827
[45] May 25, 1982

[54] METHOD OF PRODUCING CURRENT LEAD-INS HAVING COAXIAL CONSTRUCTION

[75] Inventor: Wolfgang Keller, Munich, Fed. Rep. of Germany

[73] Assignee: Siemens Aktiengesellschaft, Berlin & Munich, Fed. Rep. of Germany

[21] Appl. No.: 42,142

[22] Filed: May 24, 1979

[30] Foreign Application Priority Data

May 30, 1978 [DE] Fed. Rep. of Germany ....... 2823611

[51] Int. Cl.$^3$ .......................... B01J 17/08; H05B 5/08
[52] U.S. Cl. .................................... 373/139; 174/75 C
[58] Field of Search ....................... 13/DIG. 1, 26, 27; 174/75 C; 29/828

[56] References Cited

U.S. PATENT DOCUMENTS

| 2,904,663 | 9/1959 | Emeis et al. | 13/DIG. 1 |
| 3,439,303 | 4/1969 | Purzycki | 174/75 C |
| 3,688,006 | 8/1972 | Keller | 13/DIG. 1 X |
| 3,916,088 | 10/1975 | Keller | 13/DIG. 1 X |

Primary Examiner—Roy N. Envall, Jr.
Attorney, Agent, or Firm—Herbert L. Lerner

[57] ABSTRACT

Method of producing current lead-ins having a coaxial construction which includes applying to the outer surface of a first conductor tube of given outer diameter a layer of resilient vulcanized silicone rubber having an outwardly flaring conical sealing portion at one end of the tube and pressing the first conductor tube and a second conductor tube having an inner diameter greater than the outer diameter of the first conductor tube and formed with an outwardly flaring conical end portion into one another so as to form a seal and stop against the outside at the conical portions thereof.

6 Claims, 1 Drawing Figure

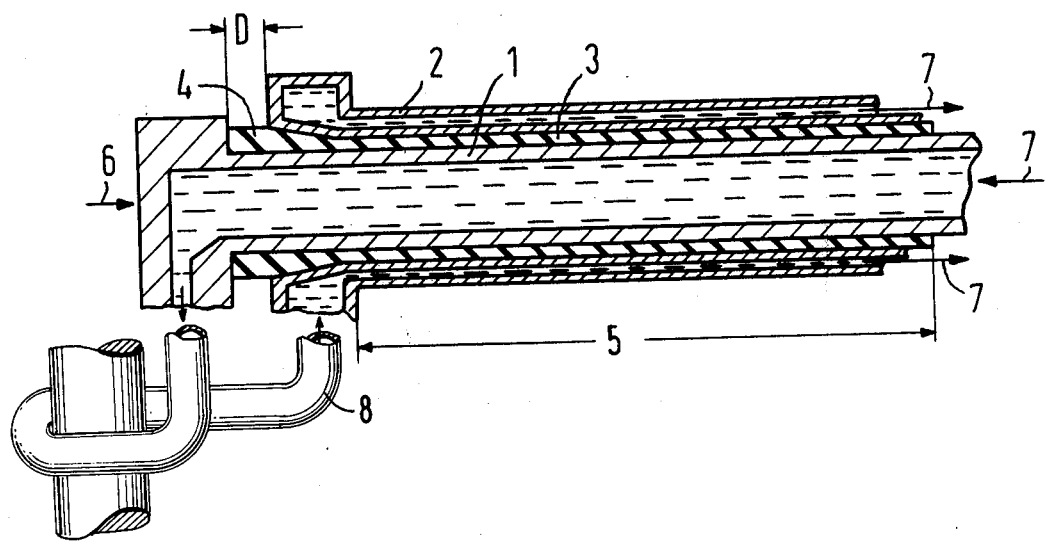

METHOD OF PRODUCING CURRENT LEAD-INS HAVING COAXIAL CONSTRUCTION

The invention of the instant application relates to a method of producing current lead-ins having a coaxial construction, especially for induction heating coils for producing a melting zone in semiconductor crystalline rods by crucible-free floating zone melting, wherein a dielectric, located between conductor tubes which are disposed coaxially one within the other, and a seal are formed of elastic or resilient, cold or hot-vulcanized silicone rubber.

The heating current for the induction heating coil in a cruciblefree zone-melting process is supplied through a current lead-in which extends through the wall of a vessel. According to U.S. Pat. No. 3,688,006, this current lead-in contains conductor tubes of varying diameters which support the induction heating coil and are disposed coaxially one within the other because of the low inductance. An intermediate layer of elastic or resilient, cold or hot-vulcanized silicone rubber is used as the dielectric.

When zone-melting relatively thick semiconductor crystalline rods, during which relatively high power is required and, therefore, also relatively great power losses occur in the current lead-in, fine leakage locations or leaks between the intermediate layer of insulation material and the surface of the conductor tubes of the current-lead in can develop during the operation, because the insulating material therebetween can easily tear away from the conductor tubes thereat because of the thermal stress.

It is therefore, an object of the invention of the instant application to provide a current lead-in of coaxial construction and a method of production thereof which ensures good sealing of the silicone rubber layer on the conductor tubes so as to eliminate leaks in the current lead-ins.

With the foregoing and other objects in view, there is provided, in accordance with the invention a method of producing current lead-ins having a coaxial construction, which comprises applying to the outer surface of a first conductor tube of given outer diameter a layer of resilient vulcanized silicone rubber having an outwardly flaring conical sealing portion at one end of the tube, and pressing the first conductor tube and a second conductor tube having an inner diameter greater than the outer diameter of the first conductor tube and formed with an outwardly flaring conical end portion into one another so as to form a seal and stop against the outside at said conical portions thereof.

In accordance with another mode of the invention, the method comprises applying the silicone rubber layer to the first conductor tube in a casting mold, allowing the silicone rubber layer to harden, and thereafter removing the casting mold.

In accordance with a further aspect of the current lead-in having a coaxial construction produced in accordance with the foregoing method, comprising coaxial inner and outer conductor tubes and, intermediate the tubes, a silicone rubber layer formed with a resilient outwardly flaring conical portion at least at one end thereof.

In accordance with an added mode of the invention, wherein the current lead-ins are connected to an induction heating coil for producing a melting zone in semiconductor crystalline rods by crucible-free floating-zone melting, the method includes providing the conical sealing of the silicone rubber so that it flares outwardly in direction toward the induction heating coil.

In accordance with a concomitant feature of the invention, wherein the current lead-ins are connected to an induction heating coil for producing a melting zone in semiconductor crystalline rods by crucible-free floating-zone melting, the conical portion of the silicone rubber layer flares outwardly in direction toward the induction heating coil.

Other features which are considerd as characteristic for the invention are set forth in the appended claims.

Although the invention is illustrated and described herein as embodied in a method of producing current lead-ins having coaxial construction, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing which is a longitudinal sectional view of a current lead-in to an induction heating coil constructed in accordance with the invention.

In the interest of clarity, the high frequency generator for supplying current to the induction heating coil has been omitted from the drawing.

Referring now more specifically to the figure of the drawing, there is shown therein an inner coaxial conductor tube 1, on which a silicone rubber layer 3 has been cast or molded in such a manner that an outwardly flaring conical enlargement 4 is produced at the end thereof leading an induction heating coil 8. The assembly formed of the inner coaxial tube 1, the silicone rubber layer 3 and the conical enlargement 4 is pressed into an outer coaxial conductor tube 2 in direction of the arrow 6 such a distance that a predetermined spacing D is formed as shown in the figure. A secure seal is thereby formed in in the region of the conical extension 2 and the coaxial system is thereby locked or stopped. In the region 5 of the coaxial system, the silicone rubber layer 3 is formed somewhat thinner than the hollow space between the two conductor tubes 1 and 2. The arrows 7 indicate the flow direction of a coolant loop, in which the induction heating coil 8 is included. The silicone rubber layer 3 is applied in a special mold of conventional construction to the inner conductor tube 1 which is formed of copper as is the outer conductor tube 2. After the rubber layer has set or hardened, the special mold is removed.

There are claimed:

1. Method of producing current lead-ins having a coaxial construction which comprises applying to the outer surface of a first conductor tube of given outer diameter a layer of resilient vulcanized silicone rubber having an outwardly flaring conical sealing portion at one end of the tube and pressing the first conductor tube and a second conductor tube, having an inner diameter greater than the outer diameter of the first conductor tube and formed with an outwardly flaring conical end portion, into one another so as to form a seal and stop against the outside at said conical portions thereof.

2. Method according to claim 1 which comprises applying the silicone rubber layer to the first conductor tube in a casting mold, allowing the silicone rubber layer to harden, and thereafter removing the casting mold.

3. Method according to claim 1 wherein the current lead-ins are connected to an induction heating coil for producing a melting zone in semiconductor crystalline rods by crucible-free floating zone melting, and wherein the conical sealing of the silicone rubber flares outwardly in direction toward the induction heating coil.

4. Current lead-ins having a coaxial construction comprising coaxial inner and outer conductor tubes said outer tube having an outwardly flaring conical end portion and, intermediate said tubes, a silicone rubber layer formed with a resilient outwardly flaring conical portion at least at an end thereof surrounding said flaring conical end portion of said outer tube and forming therewith a seal and a stop against the outside.

5. Current lead-ins according to claim 3 connected to an induction heating coil for producing a melting zone in semiconductor crystalline rods by crucible-free floating zone melting, wherein the conical portion of the silicone rubber layer flares outwardly in direction toward the induction heating coil.

6. Method of producing current lead-ins having a coaxial construction which comprises applying to the outer surface of a first conductor tube of given outer diameter a layer of resilient vulcanized silicone rubber having an outwardly flaring conical sealing portion fixed at one end of the tube against expansion in axial direction of the tube, and pressing the first conductor tube into a second conductor tube, having an inner diameter greater than the outer diameter of the first conductor tube and formed with an outwardly flaring conical end portion, so as to cause the outwardly flaring conical end portion of the second conductor tube to ride up on and simultaneously compress the axially fixed outwardly flaring conical sealing portion of the layer of resilient vulcanized silicone rubber so as to form a seal and stop against the outside at said conical portions.

* * * * *